(12) United States Patent
Yuan et al.

(10) Patent No.: US 6,934,899 B2
(45) Date of Patent: Aug. 23, 2005

(54) VARIABLE SELF-TIME SCHEME FOR WRITE RECOVERY BY LOW SPEED TESTER

(75) Inventors: Der-Min Yuan, Hsin-Chuang (TW); Bor-Doou Rong, Chupei (TW)

(73) Assignee: Etron Technology, Inc., Hsin-Chu (TW)

( * ) Notice: Subject to any disclaimer, the term of this patent is extended or adjusted under 35 U.S.C. 154(b) by 552 days.

(21) Appl. No.: 10/060,481

(22) Filed: Jan. 30, 2002

(65) Prior Publication Data

US 2003/0145260 A1 Jul. 31, 2003

(51) Int. Cl.[7] .......................... G01R 31/28; G11C 29/00
(52) U.S. Cl. ...................................... 714/734; 714/718
(58) Field of Search ................................ 714/718, 724, 714/725, 733, 734, 730, 731, 815, 816; 365/201, 200, 230.01, 233; 711/200, 220

(56) References Cited

U.S. PATENT DOCUMENTS

| | | | |
|---|---|---|---|
| 5,896,399 A | 4/1999 | Lattimore et al. ......... 371/21.4 |
| 6,151,270 A | * 11/2000 | Jeong ......................... 365/233 |
| 6,230,292 B1 | 5/2001 | Duesman et al. ........... 714/718 |
| 6,237,115 B1 | 5/2001 | Ting et al. .................. 714/718 |
| 6,334,174 B1 | * 12/2001 | Delp et al. .................. 711/167 |
| 2001/0008488 A1 | * 7/2001 | Shinozaki ..................... 365/63 |

* cited by examiner

Primary Examiner—Christine T. Tu
(74) Attorney, Agent, or Firm—George D. Saile; Stephen B. Ackerman

(57) ABSTRACT

In accordance with the objectives of the invention a new method is provided for testing DRAM cells using a slow-speed tester. An adjustable self-time scheme is provided that is used for write-recovery during the testing of DRAM devices using a low-speed tester. CSL and WL pulses are self-time controlled and are in this manner used to emulate DRAM operation under different operational conditions. The adjustable self-time scheme of the invention can be used to screen write recovery (twr) depending on field requirements for the DRAM cell, a low-speed tester can be used for the screening.

18 Claims, 5 Drawing Sheets

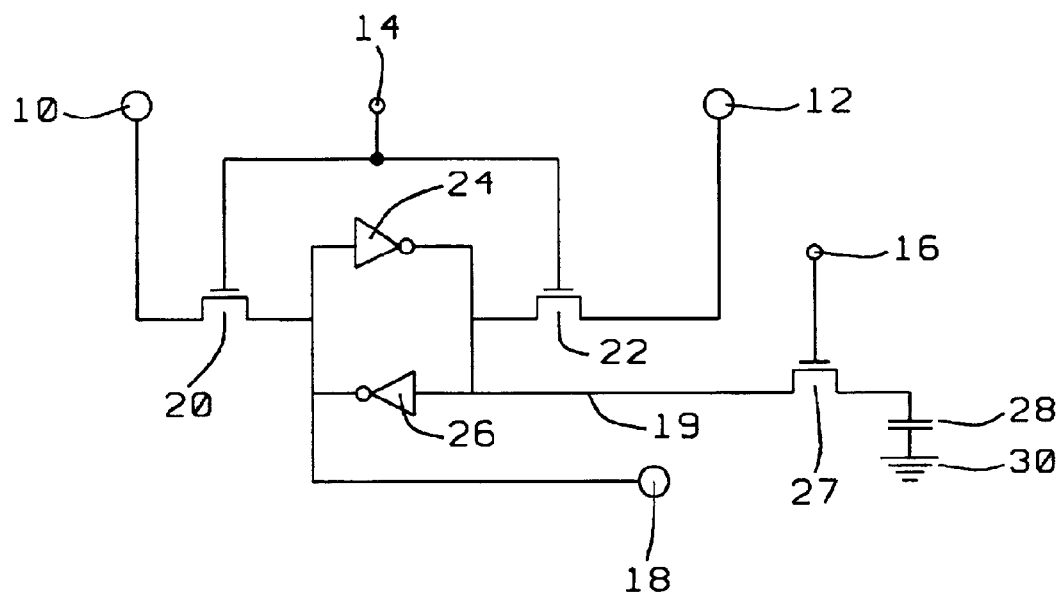
FIG. 1 - Prior Art
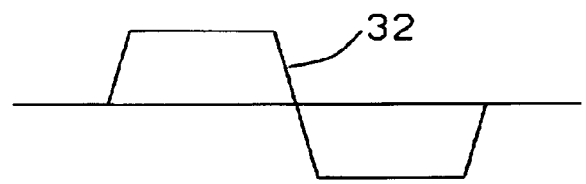
FIG. 2a - Prior Art
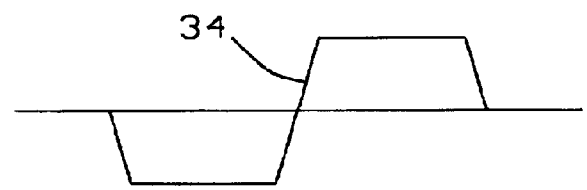
FIG. 2b - Prior Art

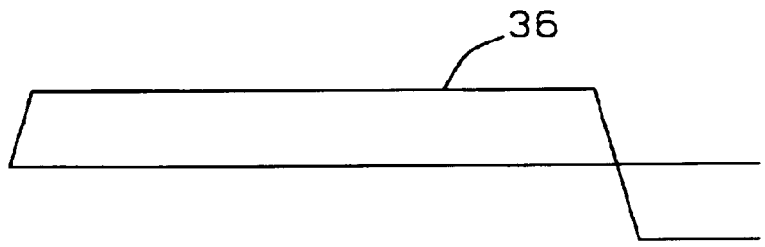
FIG. 2c – Prior Art
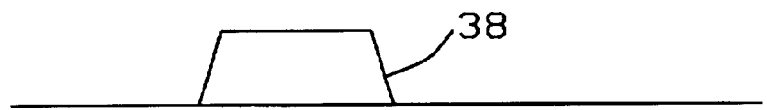
FIG. 2d – Prior Art
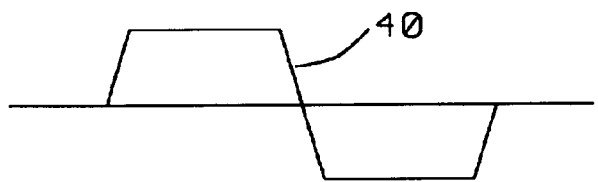
FIG. 2e – Prior Art
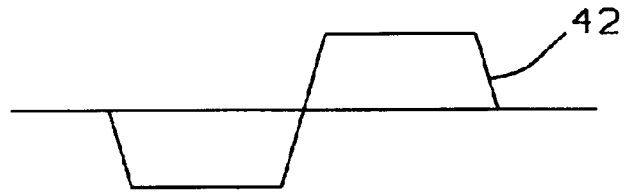
FIG. 2f – Prior Art

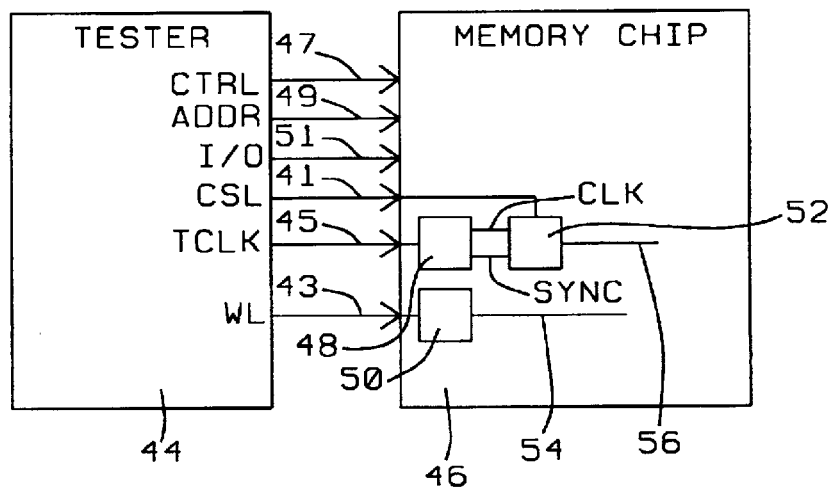
*FIG. 5*
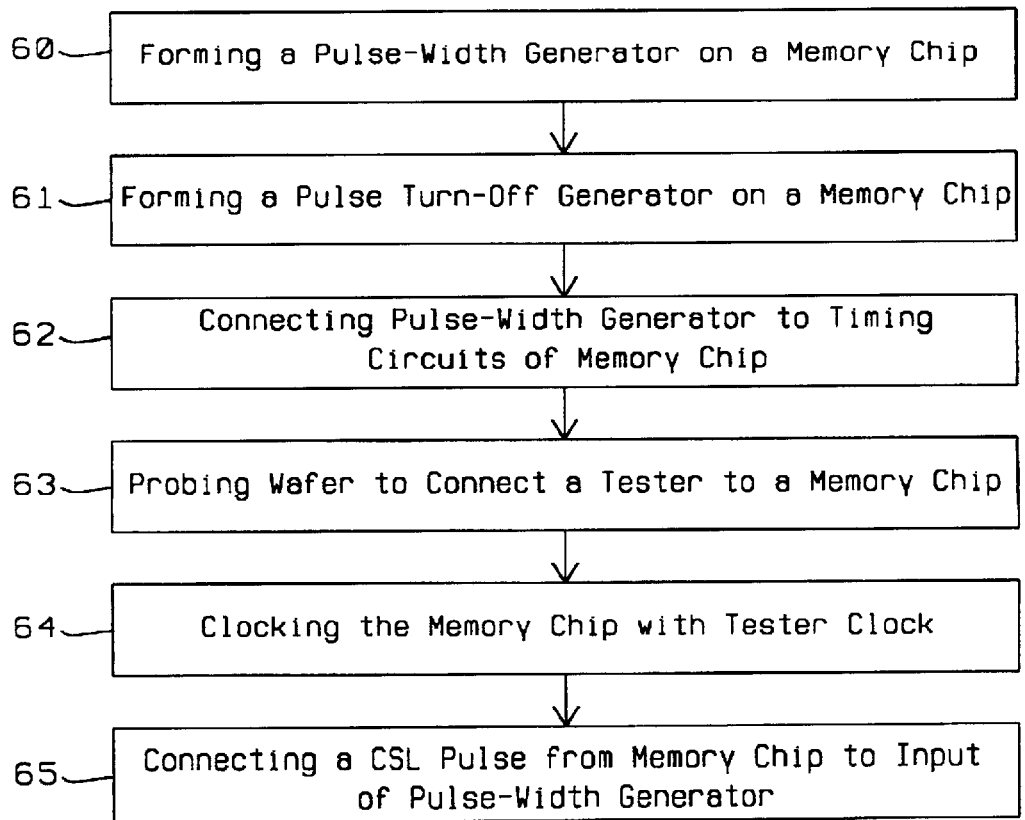
*FIG. 6a*

VARIABLE SELF-TIME SCHEME FOR WRITE RECOVERY BY LOW SPEED TESTER

BACKGROUND OF THE INVENTION (1) Field of the Invention

The invention relates to the fabrication of integrated circuit devices, and more particularly, to a method for testing failing bits of DRAM devices during chip probe testing.

(2) Description of the Prior Art

Data storage or memory devices that are extensively applied in the semiconductor technology are the Dynamic Random Access Memory (DRAM) and the Static Random Access Memory (SRAM) chips. A single DRAM cell stores a bit of data on a capacitor as an electrical charge and typically consists of a single Metal Oxide Semiconductor Field Effect Transistor (MOSFET) for data access and a single capacitor for data storage. Continuing reduction in device feature size results, for these storage cells, in serious limitations of increased data storage capability. The process technology in the manufacturing of SPAM and DRAM devices has, during the last several decades, migrated from 0.8 $\mu$m 4M memories to 0.18 $\mu$m 256M memories with a continuing decrease in memory cell size and concurrent increase in memory capacity. DRAM devices continue to be used heavily since these devices require less substrate surface space than comparable devices.

Current semiconductor devices are being operated at continuously increasing speed, the operational speed of memory chips must in therefore also be increased. This places increased demands on the testing of the memory devices, the development of faster testers results in more expensive methods of testing the memory devices. To enhance memory device throughput, memory chips need to be tested while these chips are still part of a wafer. The testing of memory chips is aimed at testing for failing chips, memory chips that pass this test are at the same time sorted in accordance with the performance of the device.

U.S. Pat. No. 6,237,115 (Ting et al.) provides a design for testability in very high-speed memory cells. This invention provides for a test circuit that is formed on a high speed memory chip to allow performance testing of the memory chip that is still part of a wafer or that has been packaged. A low speed tester can be used in this manner, reducing the cost impact of the testing operation. The test circuit creates a timing delay that is used as a reference for testing.

U.S. Pat. No. 5,896,399 (Lattimore et al.) provides a system and method for testing self-timed memory arrays by allowing some parts of the array to use a Static Evaluation technique. The array area and the timing of the array are not affected by the testing and can therefore continue to function under normal conditions. Functions and data may become pseudo-static at the first part of the clock cycle.

U.S. Pat. No. 6,230,292 (Duesman et al.) provides for methods of testing memory devices during the writing and reading of test information to and from the memory cells. Operational parameters of the device are controllably adjusted in an effort to imbalance or alter the voltage differential that is observed on the bit lines. The response of the sense amplifier, by incorrectly sensing the intended test information that is stored in the memory cells, indicates a defect in the memory device.

The invention detects fail bits of a DRAM cell during chip probe testing, in this manner saving test time and accurately detecting failing bits and providing a means for repairing the memory device at the time of chip probing. The column select (CSL) and word line (WL) pulses are under the instant invention self-time controlled, allowing emulating DRAM operation for different operating conditions.

U.S. Pat. No. 6,237,112 (Ting et al.) discloses a test circuit on a high-speed memory chip for performance testing the chip on a low speed tester. The test circuit creates a timing delay that is used as a reference for testing of the memory chip.

U.S. Pat. No. 5,896,399 (Lattimore et al.) describes a self-timed memory array test method. Functions and data may become pseudo-static during the first part of the clock cycle.

U.S. Pat. No. 6,230,292 (Duesman et al.) teaches methods for testing the cell margin in memory devices. Critical voltages and timings may be manipulated to test cell performance.

SUMMARY OF THE INVENTION

A principle objective of the invention is to provide a method for the detection of fail bits of a DRAM cell during chip-probe testing of the cell.

Another objective of the invention is to provide a method of testing a DRAM cell that saves test time.

A still further objective of the invention is to provide a method of testing a DRAM cell that allows for repairing a failing DRAM cell during chip-probe testing of the cell.

In accordance with the objectives of the invention a new method is provided for testing DRAM cells using a slow-speed tester. An adjustable self-time scheme is provided that is used for write-recovery during the testing of DRAM devices using a low-speed tester. CSL and WL pulses are self-time controlled and are in this manner used to emulate DRAM operation under different operational conditions. The adjustable self-time scheme of the invention can be used to screen write recovery (twr) depending on field requirements for the DRAM cell, a low-speed tester can be used for the screening.

BRIEF DESCRIPTION OF THE DRAWINGS

FIG. 1 shows a prior art DRAM bit line sense amplifier with a cell.

FIGS. 2a through 2f show a summary of prior art operational signals for a DRAM bit line sense amplifier.

FIG. 5 shows an overview of the implementation of the self-timed WL and CSL pulses of the invention with the interface between the memory chip and the tester.

FIGS. 6a and 6b show an operational flow chart of the implementation of the invention.

DESCRIPTION OF THE PREFERRED EMBODIMENTS

Figure 3:
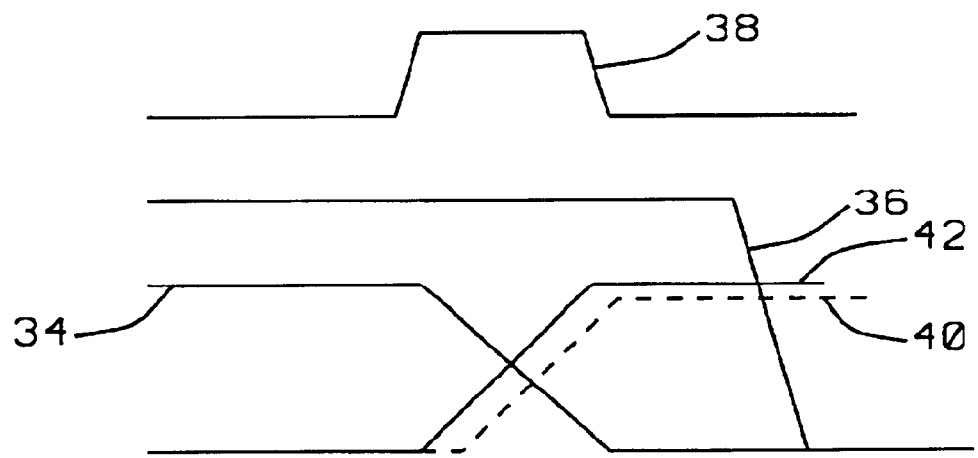
FIG. 3 shows a comprehensive diagram of the pulses that are of interest to the invention.

In test mode, several registers are available that can be used to control the on-width of the CSL and WL pulses. In this manner the on-width of the CSL pulse can be adjusted by for instance 4 or 5 nanoseconds. Equally valid, the WL fall time, which is timed with respect to the CMD rise time, can be adjusted. These adjustments are applied to a conventional DRAM cell sense amplifier, the operation of which will first be highlighted using FIG. 1.

Highlighted in FIG. 1 are the following components, which collectively form a standard DRAM bit line sense amplifier driving a DRAM cell:

10, a first data line input DLB 12, a second data line input DL 14, a column select input CSL 16, a word line input WL 18, a first bit line output BLB 19, a second bit line output BL, connected to the source/drain of transistor 27

20 and 22, CSL transistors 24 and 26, inverters for DLB and DL input data lines respectively 27, the word line select transistor 28, a DRAM cell, and 30, ground connection for the DRAM cell.

The timing diagrams associated during a write operation of the sense amplifier of FIG. 1 are shown in FIGS. 2a through 2f, as follows:

FIG. 2a shows the DL signal 32, valid for point 12, FIG. 1

FIG. 2b shows the DLB signal 34, valid for point 10, FIG. 1

FIG. 2c shows the WL signal 36, valid for point 16, FIG. 1

FIG. 2d shows the CSL signal 38, valid for point 14, FIG. 1

FIG. 2e shows a BL timing diagram 40, valid for point 19, FIG. 1

FIG. 2f shows a BLB timing diagram 42, valid for point 18, FIG. 1.

The operation of the sense amplifier that is shown in FIG. 1 can be explained as follows: a rising CSL pulse inputted on point 14 places transistors 20 and 22 in a conductive state. The data DL that has been placed on input point 12 is passed on to converter 26 and is converted into the BLB signal that is fed to point 18. The data DLB that has been placed on input point 10 is passed on to converter 24 and is converted into the BL signal that is fed to cell 28. The pulse that is shown in FIG. 2e is applied to cell 28, causing the cell voltage charge curve of FIG. 2e. Pulses DL and DLB drive BL and BLB respectively. The word line pulse curve as shown in FIG. 2c activates, by raising the gate electrode voltage of transistor 27, access the cell 28 and therefore enables charging of cell 26. Of interest to and addressed by the invention is the amount of time that is available before the WL pulse, as shown in FIG. 2c, can be turned off such that cell 28 is adequately charged.

It must thereby be pointed out that the enabling of the data write, as provided by the CSL command that is shown in FIG. 2d, enables a write operation that is accompanied by a auto-precharge operation. That is, the base line around which the pulse curves of FIGS. 2a and 2b are shown, represents a base line whereby BL and BLB have been pre-set to a value of ½ $V_{cc}$, this in order to prepare these lines for the next in sequence small signal sensing operation.

Further, the frequency of the CSL pulse of FIG. 2d is controlled by the frequency of the clock of the tester. The wafer level test of DRAM devices is a relatively slow speed test with a test speed of 50 MHz, the CSL pulse being active for about 20 nanoseconds. The chip that is being tested is designed to perform at a speed of 200 or 250 MHz. It is therefore required to provide a method of DRAM device testing which accommodates this difference in speed between the tester and the operational frequency of the chip that is being tested.

This latter concern is further highlighted in the combined timing diagram that is shown in FIG. 3. Shown therein are the timing curves that previously have been highlighted and that therefore will not be explained at this time. Key to the timing curves shown in FIG. 3 are the relative time frame in which these curves occur.

Figure 4A:
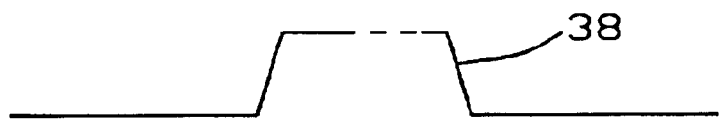
FIGS. 4a and 4b show the self-time controlled WL and CSL pulses that are affected by the invention.
Figure 4B:
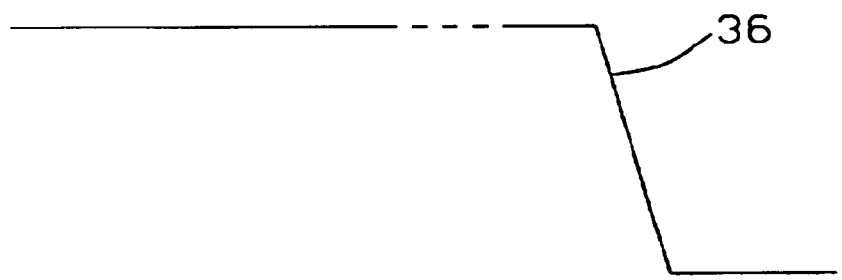

From this the concerns addressed by the invention can further be condensed into the curves shown in FIGS. 4a and 4b, indicating that the invention addresses the period of time that the CSL pulse remains on (the duration of the CSL pulse), signal 38, FIG. 4a, and the time at which the WL pulse is turned off, signal 36, FIG. 4b.

The combination of these two aspects of the invention provides for the essential objective of the invention, that is to provide for an adjustable self-time scheme for write recovery for DRAM devices that operate at a speed which is considerably higher than the speed of the tester that is used to test the DRAM devices.

The first aspect of the invention, as highlighted in FIG. 4a, will be addressed first with reference to U.S. Pat. No. 6,237,115 B1 (Ting et al.). Details of the implementation of the timed-delay that is provided by the referenced US Patent are provided by the patent and do not need to be repeated at this time. U.S. Pat. No. 6,237,115 provides for a method that can be referred to as a pulse width generator and is highlighted as follows:

a test circuit is embedded on a memory chip, the test circuit is connected to timing circuits of the memory chip a tester is connected to the memory chip by probing the memory chip the tester provides a tester clock pulse to the timing circuit of the memory chip; the tester also provides additional signals to the memory chip such as I/O signals, addressing signals and control signals, these latter signals are not germane to the invention the test circuit uses a sync pulse, which is developed internal to the memory chip and which is synchronized with the tester clock the leading edge of the sync pulse is directly passed on to the output of the test circuit, the trailing edge of the sync pulse is delayed the test circuit is enabled the delayed trailing edge of the sync pulse is connected to the output stage of the test circuit by combining the delayed trailing edge of the input sync pulse that has been inputted to the test circuit with the sync pulse, the test circuit creates a pulse that comprises a timing delay window; the memory chip can now be tested under conditions created by the timing delay window; the timing delay window may be adjusted to be less than the period of the tester clock the timing delay window of the test chip can be adjusted by means of fusible links in combination with capacitors that are part of the test circuit the delayed trailing edge of the sync pulse can also be used as a leading edge of the output of the test circuit for a next test cycle.

U.S. Pat. No. 6,237,115 B1 can further be extended by first mounting the memory chip in a die package after which the completed package can be tested. The delaying of the trailing edge of the sync pulse is achieved using a RC delay network that is part of a timer circuit of the test circuit, by selecting different values for the capacitance of the RC network the amount of delay can be controlled.

In sum: U.S. Pat. No. 6,237,115 provides a pulse width generator for creating a pulse whereby the length of the pulse can be varied and adjusted. This is what is required in part by the instant invention as has previously been highlighted with FIG. 4a, that is the length of the CSL pulse is adjusted.

As a second part of the invention, the turn-off time of the WL is controlled and adjusted. This is highlighted by referring to U.S. Pat. No. 6,058,069 (Ting et al.), which provides a method that can be referred to as a pulse turn-off delay generator which provides a protection circuit to ensure the DRAM signal-in write cycle. Methods are provided to ensure that the last write operation in a DRAM column cycle is not turned off before the bit line restore is completed, thus avoiding that data is destroyed in the next access. The highlights of U.S. Pat. No. 6,058,069 can be summarizes as follows:

- a row activation command is received, a row-activation flag is created upon receipt of the row activation command
- a column cycle is initiated
- a number "n" write pulses WRPLS are created during the column cycle
- the "n" WRPLS pulses are applied as an input to a TWR timing reference component
- the TWR reference component generates "n" TWR_PRO pulses the "n" TWR_PRO pulses are applied to a capacitor, the falling edges of the "n" TWR_PRO pulses charges the capacitor, which is part of the TWR reference component, while the trailing edges of the "n" TWR_PRO pulses discharges the capacitor, thus never allowing a charge to build up in the capacitor up to the point where the last of the "n" TWR_PRO pulses is applied to the capacitor, at which time the falling edge of the last pulse charges the capacitor
- due to the charge on the capacitor of the TWR reference component, the TWR_PRO pulse drops.

The above highlighted ability is used by U.S. Pat. No. 6,058,069 to apply the "n" WRPLS pulses to a timing reference component to initiate "n" write operations during a column cycle, in response to the "n" WRPLS pulses are created "n" TWR_PRO pulses, a precharge command is received and registered, a bit line precharge is ended after the last of the "n" TWR_PRO pulses has fallen at which time a precharge command is issued, the internal memory device TWR time is increased by reducing an internal device TRP timer thus protecting the last data written. The invention can be applied for applications where each of the "n" TWR_PRO pulses has a pulse width that exceeds an internal TWR time specification, the internal TWR time specification can be the minimum time that is required to completely write data into all cell capacitances. The precharge command may be received and registered prior to full restoration of the bit lines while it is the objective that pulse width variations of the TWR_PRO pulses, caused by process variations in the timing reference component and by variations of the time that is required to write data into all capacitance, track each other.

In sum: U.S. Pat. No. 6,058,069 provides a pulse turn-off generator whereby a signal, such as the WL pulse of FIG. 4b, can be prevented from dropping in value by a time that is delayed by a controllable amount.

FIG. 5 shows a diagram of how to combine the two methods that have been provided by the previously quoted and referred to U.S. Pat. No. 6,237,115 and U.S. Pat. No. 6,058,069. That is:

- 44, a tester that is used to test memory devices; inputs that have been highlighted and that are provided by the tester to the memory chip are such signals as control signals (47), address signals (49), I/O signals (51), the CSL (41) and WL (43) signal, and clock signal (45)
- 46, the memory chip that is tested by tester 44
- 48 and 52, the pulse width generator that has been highlighted above using FIG. 4a as an objective
- 50, the pulse turn-on delay generator that has been highlighted above using FIG. 4b as an objective
- 54, the WL signal that has been provided with delayed turn-off as compared with the WL signal 43 that is provided by the tester 44 to the memory chip 46
- 56, the CSL signal that has been provided with a controlled-on period as compared with the CSL signal 41 that is provided by the tester 44 to the memory chip 46.

Figure 6B:
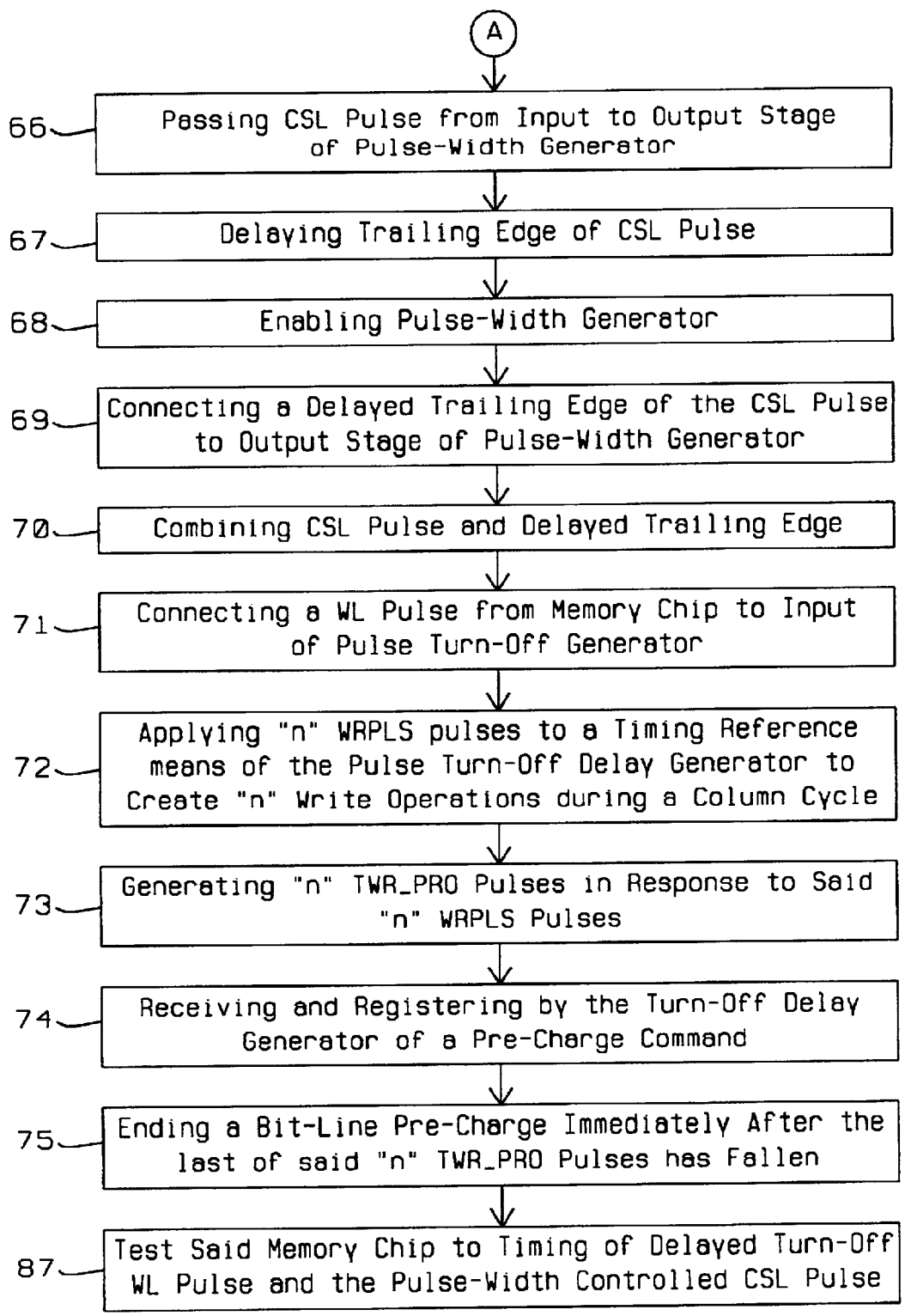

As a final method that can be followed using the invention, the following sequence may be used that produces the times delay of the WL signal in combination with pulse width adjustments of the CSL pulse. As follows, see the flow diagram of FIGS. 6a and 6b:

- a test circuit, FIG. 6a, step 60, is formed on a memory chip, the test circuit has been connected to timing circuits of the memory chip and has been provided with a pulse width generator for the control of the on-period of a first signal
- a pulse turn-off generator, FIG. 6a, step 61, is formed on the memory chip on which the test circuit has been formed, the turn-off generator has the ability to delay turn-off of a second signal
- the pulse-width generator circuit is connected to the timing circuit of the memory chip, step 62, FIG. 6a
- probing a wafer, FIG. 6a, step 63, by connecting a tester to the memory chip that is contained in or on the surface of the wafer
- clocking the memory chip with the tester clock, FIG. 6a, step 64, thereby enabling the test circuit
- connecting a CSL signal, FIG. 6a, step 65, as a first signal from said tester to said pulse width generator, creating a CSL signal of varying signal width by
- passing the CSL pulse from the input of the pulse-width generator to the output, step 66, FIG. 6b
- delaying the trailing edge of the CSL pulse in the pulse width generator, step 67, FIG. 6b
- enabling the pulse-width generator, step 68, FIG. 6b
- connecting a delayed trailing edge of the CLS pulse generator to the output stage of the pulse-width generator, step 69, FIG. 6b
- combining the CSL pulse and the delayed trailing edge of the CSL pulse, step 70, FIG. 6b
- connecting a WL signal, FIG. 6b, step 65, as a second signal from said tester to said pulse turn-off delay generator, step 71, FIG. 6b, creating a WL signal of which the turn-off can be controlled by
- applying "n" WRPLS pulses to a timing reference means of the pulse turn-off delay generator, step 72, FIG. 6b, to create "n" write operations during a column cycle
- generating "n" TWR_PRO pulses in response to said "n" WRPLS pulses, step 73, FIG. 6b
- receiving and registering by the turn-off delay generator of a pre-charge command, step 74, FIG. 6b ending a bit line pre-charge only after the last of said "n" TWR_PRO pulses has fallen, step 75, FIG. 6b, and combining said CSL signal of varying signal width with said WL signal of controlled turn-off, forming a write recovery period of the memory chip for performance testing, FIG. 6b, step 78, the memory chip to timing of the write recovery period of the memory chip.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of performing high-speed memory testing using a low speed tester, comprising:

forming a test circuit on a memory chip on a wafer, said test circuit performing a pulse-width generator function by modifying a sync pulse on the memory chip to produce a column select signal with controlled time-on period;

forming a pulse turn-off generator on a memory chip of said wafer, said pulse turn-off generator modifying a write line signal with controlled turn-off delay;

enabling said test circuit by connecting a clock signal and a sync signal from said tester to said test circuit;

connecting said column select signal from said tester to said pulse turn-off generator of said test circuit of said memory chip, forming a column select signal with controlled time-on period;

connecting said write line from said tester to said pulse turn-off generator on a memory chip, forming a modified write line signal with controlled turn-off delay;

combining said column select signal with controlled time-on period with said modified write line signal with controlled turn-off delay, creating a write recovery period of the memory chip; and testing said memory chip in said write recovery period.

2. The method of claim 1, wherein said test method is performed during wafer probing.

3. The method of claim 1, wherein said test method is performed during testing of a packaged memory chip using a low speed tester.

4. The method of claim 1, wherein said write recovery period is less than a period of a tester clock.

5. The method of claim 1, said pulse-width generator comprising the functions of:

receiving a clock pulse from said tester;

receiving a sync pulse from said memory chip;

passing said sync pulse from the memory chip from the input to the output of said pulse-width generator; and delaying trailing edge of said sync pulse.

6. The method of claim 5, said delaying said trailing edge of said sync pulse being achieved in a timer circuit, which passes a leading edge quickly and delays said trailing edge.

7. The method of claim 5, said delaying said trailing edge of said sync pulse being achieved in a RC delay network of a timer circuit, delay being adjusted by selecting a different amount of capacitance.

8. The method of claim 1, said pulse turn-off generator comprising:

receiving a row activation command;

creating a row-activation flag upon receipt of the row activation command;

initiating a column cycle;

writing a number of "n" WRPLS pulses during the column cycle;

applying the "n" WRPLS pulses as an input to a TWR reference component; generating "n" TWR_PRO pulses by the TWR reference component;

applying the "n" TWR_PRO pulses to a capacitor which is part of the TWR reference component, the falling edges of the "n" TWR_PRO pulses charging the capacitor, the trailing edges of the "n" TWR_PRO pulses discharging the capacitor, a last falling edge of the "n" TWR_PRO pulses applied to the capacitor charging the capacitor;

internally generating a precharge command; and ending a bit line precharge immediately after the last of said "n" TWR_PRO pulses has fallen.

9. The method of claim 8, each of said "n" TWR_PRO pulses having an adjustable pulse width in order to screen-out fail bits of the TWR specification.

10. A test circuit for performing high-speed memory testing using a slow speed tester, comprising:

a test circuit on a memory chip on a wafer, said test circuit comprising means for performing a pulse-width generator function by modifying a sync pulse on the memory chip to produce a column select signal with controlled time-on period;

a pulse turn-off generator on a memory chip of said wafer, said pulse turn-off generator comprising means for modifying a write line signal with controlled turn-off delay;

said test circuit being enabled by connecting a clock signal and a sync signal from said tester to said test circuit;

said column select signal being connected from said tester to said pulse turn-off generator of said test circuit of said memory chip, a column select signal being formed with controlled time-on period;

said write line being connected from said tester to said pulse turn-off generator on a memory chip, a modified write line signal being formed with controlled turn-off delay;

said column select signal with controlled time-on period being combined with said modified write line signal with controlled turn-off delay, a write recovery period of the memory chip having been created; and said memory chip being tested in said write recovery period.

11. The test circuit of claim 10, said memory chip being tested being performed by connecting said memory chip to a memory module, testing a packaged memory chip.

12. The test circuit of claim 10, said write recovery period being less than a period of a tester clock.

13. The test circuit of claim 10, said pulse-width generator comprising:

means for receiving a clock pulse from said tester;

means for receiving a sync pulse from said memory chip;

means for passing said sync pulse from the memory chip from the input to the output of said pulse-width generator; and means for delaying trailing edge of said sync pulse.

14. The test circuit of claim 13, said means for delaying said trailing edge of said sync pulse being a timer circuit, which passes a leading edge quickly and delays said trailing edge.

15. The test circuit of claim 13, said delaying said trailing edge of said sync pulse being achieved in a RC delay network of a timer circuit, delay being adjusted by selecting a different amount of capacitance.

16. The test circuit of claim 10, said pulse turn-off generator comprising:
- means for receiving a row activation command;
- means for creating a row-activation flag upon receipt of the row activation command;
- means for initiating a column cycle;
- means for writing a number of "n" WRPLS pulses during the column cycle;
- means for applying the "n" WRPLS pulses as an input to a TWR reference component;
- means for generating "n" TWR_PRO pulses by the TWR reference component;
- means for applying the "n" TWR_PRO pulses to a capacitor which is part of the TWR reference component, the falling edges of the "n" TWR_PRO pulses charging the capacitor, the trailing edges of the "n" TWR_PRO pulses discharging the capacitor, a last falling edge of the "n" TWR_PRO pulses applied to the capacitor charging the capacitor;
- means for receiving and registering a precharge command; and
- means for ending a bit line precharge immediately after the last of said "n" TWR_PRO pulses has fallen.

17. The test circuit of claim 16, each of said "n" TWR_PRO pulses having an adjustable pulse width in order to screen-out fail bits of the Twr specification.

18. The test circuit of claim 16, whereby pulse width variations of said "n" TWR_PRO pulses, caused by process variations in said timing reference component and the time required to write data into all cell capacitances, track each other.

* * * * *